United States Patent
Erskine et al.

(10) Patent No.: US 9,854,676 B2
(45) Date of Patent: Dec. 26, 2017

(54) ASSEMBLY COMPRISING AT LEAST AN ELECTRICAL COMPONENT MOUNTED ON A SUBSTRATE, A COMPONENT SUITABLE FOR SUCH AN ASSEMBLY AS WELL AS A METHOD FOR MOUNTING AN ELECTRICAL COMPONENT ON A SUBSTRATE

(71) Applicants: Joseph Erskine, Falkirk (GB); Alan Hardie, Eirdrie (GB); Gerard McGoogan, Taynuilt (GB)

(72) Inventors: Joseph Erskine, Falkirk (GB); Alan Hardie, Eirdrie (GB); Gerard McGoogan, Taynuilt (GB)

(73) Assignee: AKTIEBOLAGET SKF, Gothenburg (SE)

( * ) Notice: Subject to any disclaimer, the term of this patent is extended or adjusted under 35 U.S.C. 154(b) by 0 days.

(21) Appl. No.: 14/951,491

(22) Filed: Nov. 25, 2015

(65) Prior Publication Data

US 2016/0157349 A1 Jun. 2, 2016

(30) Foreign Application Priority Data

Nov. 28, 2014 (GB) .................................. 1421160.1

(51) Int. Cl.
*H05K 1/16* (2006.01)
*H05K 1/18* (2006.01)
(Continued)

(52) U.S. Cl.
CPC ............... *H05K 1/18* (2013.01); *F16C 41/00* (2013.01); *H01L 41/0475* (2013.01);
(Continued)

(58) Field of Classification Search
CPC . H05K 1/189; H05K 3/34; H05K 1/18; H01L 41/1132; F16C 41/00
See application file for complete search history.

(56) References Cited

U.S. PATENT DOCUMENTS 5,281,888 A 1/1994 Takeuchi et al.
5,993,248 A * 11/1999 Bethurum ........... H01M 2/1044
439/500

(Continued)

FOREIGN PATENT DOCUMENTS

EP 0918357 A 5/1999
JP 2008157855 A 7/2008

*Primary Examiner* — Steven T Sawyer
(74) *Attorney, Agent, or Firm* — Bryan Peckjian; SKF USA Inc. Patent Dept.

(57) ABSTRACT

An assembly comprising at least an electrical component mounted on a substrate. The component includes at least a first electrode and a second electrode. The substrate includes at least a first electrical conductor and a second electrical conductor. The first electrode is electrically connected to the first electrical conductor and the second electrode is electrically connected to the second electrical conductor. In a direction perpendicular to the substrate, the first electrode is located between the first electrical conductor and the second electrode. The second electrode is connected to the second electrical conductor by a connecting element extending between the second electrode and the second electrical conductor.

15 Claims, 6 Drawing Sheets

(51) Int. Cl.
*H01L 41/113* (2006.01)
*H05K 3/34* (2006.01)
*F16C 41/00* (2006.01)
*H01L 41/047* (2006.01)
*H01L 41/053* (2006.01)

(52) U.S. Cl.
CPC ........ *H01L 41/053* (2013.01); *H01L 41/1132* (2013.01); *H05K 3/34* (2013.01)

(56) References Cited

U.S. PATENT DOCUMENTS

| | | | |
|---|---|---|---|
| 6,064,141 A | 5/2000 | Wiciel | |
| 6,077,106 A | 6/2000 | Mish | |
| 6,108,211 A | 8/2000 | Diessner | |
| 8,460,026 B2 * | 6/2013 | Tate | H05K 1/189 439/500 |
| 2004/0050163 A1 | 3/2004 | Komninos | |
| 2007/0074587 A1 * | 4/2007 | Mol | G01L 5/0019 73/862.322 |
| 2009/0028330 A1 | 11/2009 | Grunthaner | |
| 2011/0128712 A1 * | 6/2011 | Prest | G06F 1/1626 361/783 |
| 2012/0270437 A1 | 10/2012 | Tate et al. | |

* cited by examiner

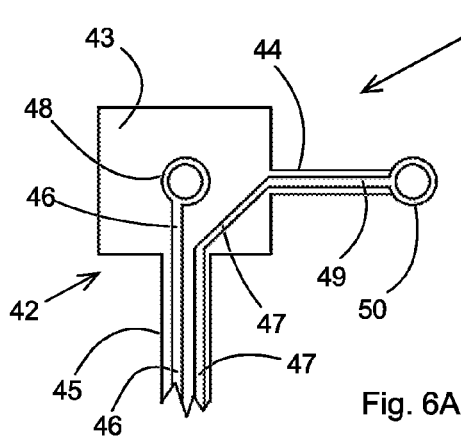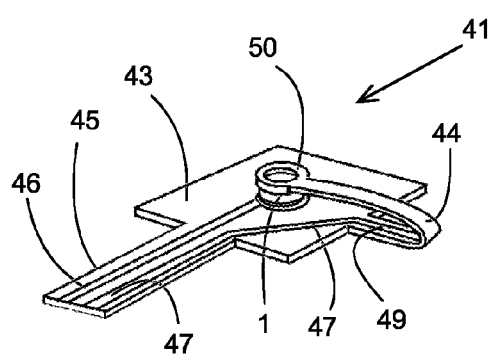
Fig. 6A  Fig. 6B
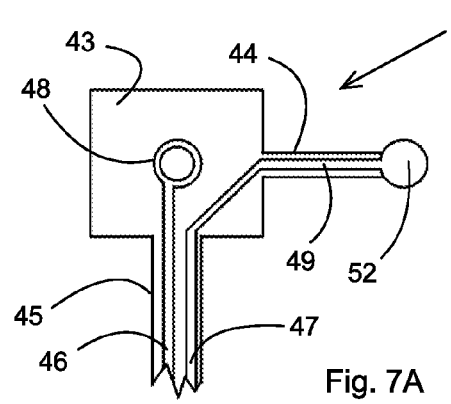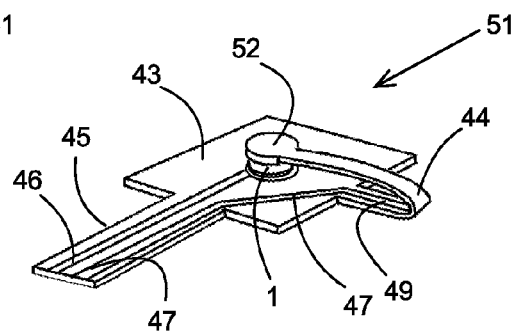
Fig. 7A  Fig. 7B

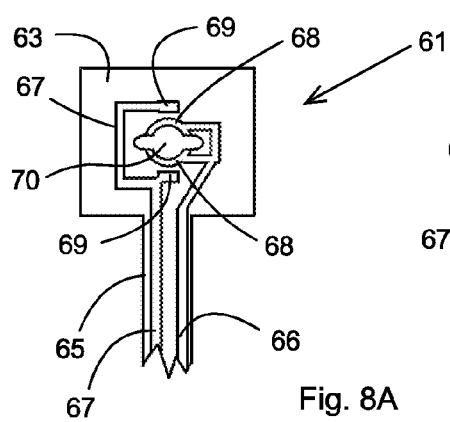
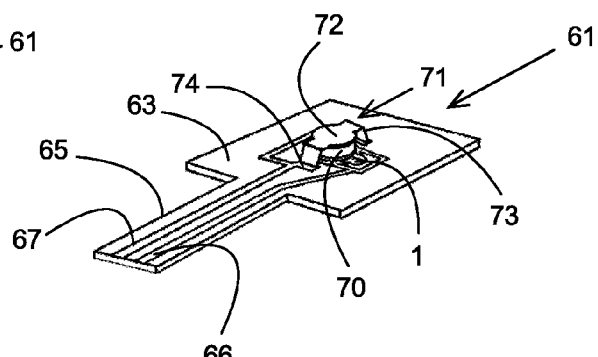
Fig. 8A  Fig. 8B
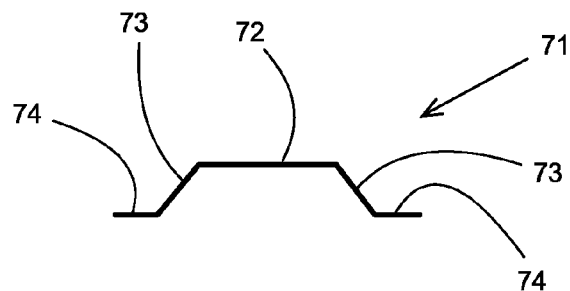
Fig. 8C

ASSEMBLY COMPRISING AT LEAST AN ELECTRICAL COMPONENT MOUNTED ON A SUBSTRATE, A COMPONENT SUITABLE FOR SUCH AN ASSEMBLY AS WELL AS A METHOD FOR MOUNTING AN ELECTRICAL COMPONENT ON A SUBSTRATE

CROSS REFERENCE TO RELATED APPLICATIONS

This is a Non-Provisional Patent Application, filed under the Paris Convention, claiming the benefit of Great Britain (GB) Patent Application Number 1421160.1, filed on 28 Nov. 2014 (28.11.2014), which is incorporated herein by reference in its entirety.

FIELD OF THE INVENTION

The invention relates to an assembly comprising at least an electrical component mounted on a substrate, which component comprises at least a first and second electrode, wherein the substrate comprises at least a first and second electrical conductor, whereby the first electrode is electrically connected to the first electrical conductor and the second electrode is electrically connected to the second electrical conductor.

The invention also relates to a component suitable for such an assembly as well as a method for mounting an electrical component on a substrate.

BACKGROUND OF THE INVENTION

In such known assembly a component is provided with two electrodes. The electrodes are spaced apart and are located in the same plane. Such a component is being used by surface-mount technology (SMT). SMT is a method for producing electronic circuits in which the components are mounted or placed directly onto the surface of a substrate like a printed circuit board (PCB) whereby the spaced apart electrodes of the components are directly connected to different electrical conductors located on the surface of the substrate.

A disadvantage of the known assembly is that the electrodes of the component need to be located in the same plane and that after connecting the component to the substrate both electrodes are located on the surface of the substrate. Such orientation of the electrodes with respect to the component as well as such orientation of the component with respect to the substrate is not always possible or desirable.

SUMMARY OF THE INVENTION

One of the objects of the invention is to provide an assembly whereby the disadvantages of the above mentioned assembly have been overcome.

This object is achieved by the assembly according to the invention in that in a direction perpendicular to the substrate, the first electrode is located between the first electrical conductor and the second electrode, whereby the second electrode is connected to the second electrical conductor by means of an connecting element extending between the second electrode and the second electrical conductor.

By the assembly according to the invention the electrodes are located on opposite sides which two sides are called in this application: a bottom side which is directed towards and located on the substrate and a top side which is located at a distance of the substrate, seen in a direction perpendicular to the substrate. The first electrode located at the bottom side is directly connected to the first connector. The second electrode located at the top side is connected to the second electrical conductor by means of the connecting element. In this manner the component can easily be connected to the substrate whilst only the first electrode is located on the surface of the substrate whilst the second electrode is located above the first electrode and the surface of the substrate. The second electrical conductor is located on the surface of the substrate adjacent to the component and is connected to the second electrode by means of the connecting element extending from the surface of the substrate to the higher located second electrode.

An embodiment of the assembly according to the invention is characterized in that the connecting element comprises a metal part connected to the second electrode and to the second electrical conductor.

Such a metal part can easily be made and provided with at least one connection portion to be connected to the second electrical conductor, a connection portion to be connected to the second electrode and a bridge portion extending between the connection portions.

The metal part is preferably connected to the second electrode before mounting the electrical component on a substrate. By mounting the electrical component with the metal part on the substrate, the first electrode will be placed on the first electrical conductor whilst simultaneously the connection portion connected to the second electrode will be placed on the second electrical conductor. This allows placement by means of pick and place machines.

The substrate electrically insulates the component from the device onto which the assembly will be mounted and any potential path thereon.

Another embodiment of the assembly according to the invention is characterized in that second connector is located on at least two opposite sides of the electrical component, whereby the metal part is connected with at least two ends at opposite sides of the electrical component to the second connector and with a part located between the at least two ends to the second electrode.

By connecting the second electrode on two opposite sides of the component to the second connector a rigid connection is being obtained, whereby tilting of the component in a direction towards the second connector is easily being prevented. It is also possible to connect the second electrode on more sides of the component to the second conductor.

The metal part can be provided at each of the two ends as well as at the part located between the two ends with a connection portion, whereby a bridge portion extending between each end and the part located between the two ends.

Another embodiment of the assembly according to the invention is characterized in that the metal part is connected to the second electrode and/or the second electrical conductor by means of a solder or electrically conducting glue.

By means of solder or electrically conducting glue an electrically connection can easily and reliable be obtained.

The advantage of a conductive, flexible glue is that it mechanically isolates the sensor from the affects of the weight of the metal part.

Another embodiment of the assembly according to the invention is characterized in that the connecting element is a flexible foil provided with a third electrical conductor, which flexible foil is connected to the substrate, whereby a first end of the third electrical conductor is connected to the second electrical conductor whilst a second end of the third electrical conductor is connected to the second electrode.

With such a flexible foil a distance between the surface of the substrate and the higher located second electrode can easily be bridged.

Another embodiment of the assembly according to the invention is characterized in that the second end of the third electrical conductor is connected to the second electrode by means of a solder or electrically conducting glue.

By means of solder or electrically conducting glue an electrically connection can easily and reliable be obtained.

Another embodiment of the assembly according to the invention is characterized in that the substrate is a flexible foil forming a whole with the flexible foil of the connecting element.

In this manner the flexible foil of the connecting element is made as an integral part of the substrate so that no separate connecting elements need to be made.

Another embodiment according to the invention is that the substrate is provided with a hole, wherein the first electrode is located at least partially around the hole.

In case that for example, the sensor is an acoustic sensor and the substrate is made of a material like polyimide being a poor transmitter for acoustic signals, the first electrode can be connected to the first connector on the substrate, whilst the component can be connected through the hole by means of a glue or adhesive having desired properties for conducting and transmitting acoustic signals from an object like a bearing.

In case the sensor comprises a ring-shaped first electrode, the glue or adhesive will be in contact with the component through the ring-shaped first electrode.

Another embodiment of the assembly according to the invention is characterized in that the component is a sensor, such as an acoustic emission sensor, a vibration sensor, an ultrasound sensor, a shear vibration crystal sensor, or other piezoelectric sensors.

Such sensors are often provided with a bottom and top electrode. The sensor can have different configurations like a disc-shape, a tube-shape, a rectangular plate-shape. By the assembly according to the invention the sensor can easily be connected to the substrate, whereby the first, bottom electrode is directly connected to the first connector and the second, top electrode is connected to the second connector by means of the connecting element.

Such a sensor may comprise a crystal located between the first and second electrode.

Another embodiment of the assembly according to the invention is characterized in that that the assembly comprises a bearing or a structure making contact with a bearing onto which bearing or structure the substrate is mounted.

By mounting the substrate, for example, provided with an acoustic emission sensor on the bearing acoustic signals from the bearing can easily be measured.

The invention also relates to a component suitable for such an assembly, which overcomes the disadvantages of the prior art component as described above.

The component according to the invention is characterized in that the component is provided with a connecting element comprising a metal part, which metal part is connected to the second electrode, whilst at least one end of the metal part is located in a same plane as the first electrode.

Such a component can easily be mounted on a substrate whereby the first electrode will get located between the second electrode and the first electrical conductor to which the first electrode is being connected.

The invention also relates to a method suitable for mounting an electrical component on a substrate, which overcomes the disadvantages of the prior art method as described above.

By the method according to the invention the component comprises at least a first and a second electrode, wherein the substrate comprises at least a first and a second electrical conductor, whereby the first electrode is being electrically connected to the first electrical conductor and the second electrode is being electrically connected to the second electrical conductor, and whereby in a direction perpendicular to the substrate, the first electrode is located between the first electrical conductor and the second electrode, whereby the second electrode is being connected to the second electrical conductor by means of an connecting element extending between the second electrode and the second electrical conductor.

With such a method a component provided with a first electrode located at the bottom of the component and a second electrode located at the top of the component can easily be connected to the substrate, whereby the first, bottom electrode is directly connected to the first connector. The second, top electrode is connected to the second connector by means of the connecting element bridging the distance between the second electrical conductor located on the surface of the substrate and the higher located second electrode.

An embodiment of the method according to the invention is characterized in that the connecting element comprises a metal part being connected to the second electrode and to the second electrical conductor by means of a solder or electrically conducting glue.

The metal part can be pre-installed onto the second electrode and the component with the metal part than become compatible with a standard surface mount assembly process.

Such a metal part provided a rigid electrical connection between the second electrode and to the second electrical conductor, which can easily be connected thereto by means of solder of electrically conducting glue.

Another embodiment of the method according to the invention is characterized in that the connecting element is a flexible foil provided with a third electrical conductor, which flexible foil is connected to the substrate, whereby a first end of the third electrical conductor is connected to the second electrical conductor whilst second end of the third electrical conductor is being connected by means of a solder or electrically conducting glue to the second electrode.

With such a flexible foil a distance between the surface of the substrate and the higher located second electrode can easily be bridged.

BRIEF DESCRIPTION OF THE DRAWINGS

FIGS. 6A and 6B are a top view and a perspective view of a substrate and a connecting element without and with a component of a fourth embodiment of an assembly according to the invention;

FIGS. 7A and 7B are a top view and a perspective view of a substrate and a connecting element without and with a component of a fifth embodiment of an assembly according to the invention;

FIGS. 8A and 8B are a top view of a substrate without and a and a perspective view of a substrate, a component and a connecting element of a sixth embodiment of an assembly according to the invention, FIG. 8C is an enlarged side view of the connecting element as shown in FIG. 8B.

In the drawings, like reference numerals refer to like elements.

DESCRIPTION OF THE FIGURES

Figure 1:
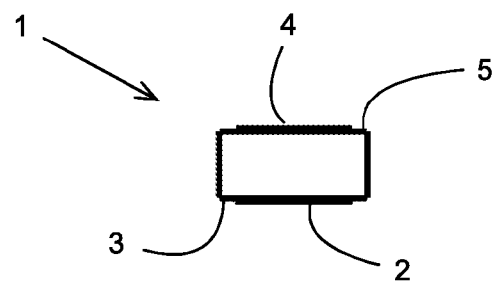
FIG. 1 is a side view of a component with a first, bottom electrode and a second, top electrode.

FIG. 1 shows a side view of an electrical component 1 comprising a first, bottom electrode 2 located on the bottom side 3 and a second, top electrode 4 located on the top side 5. Such components 1 are for example sensors, like acoustic emission sensors, vibration sensors, ultrasound sensors, shear vibration crystal sensors, or other piezoelectric sensors.

Figure 2:
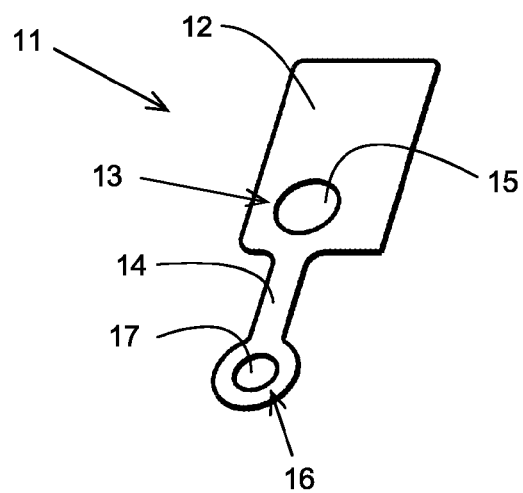
FIG. 2 is a perspective schematic view of a substrate and a connecting element of a first embodiment of an assembly according to the invention.
Figure 3:
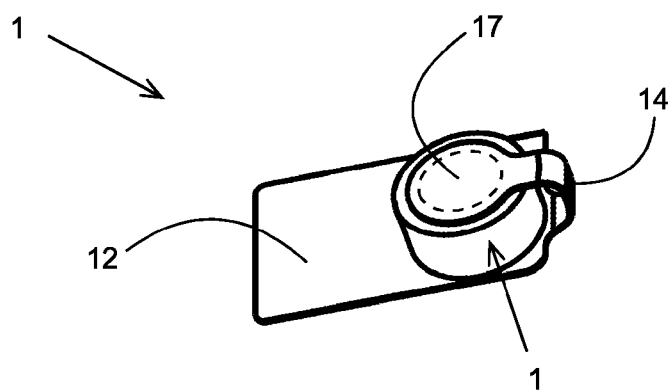
FIG. 3 is a perspective schematic view of the first embodiment according to the invention comprising the component as shown in FIG. 1 and the substrate and the connecting element as shown in FIG. 2.

FIGS. 2 and 3 shows is a perspective view of a first embodiment of an assembly 11 according to the invention. The assembly 11 comprises a substrate 12 provided with a first electrical conductor 13 and a connecting element 14 connected to the substrate 12. Only a circular part 15 of the first electrical conductor 13 is shown in FIG. 2, the first electrical conductor 13 also comprises an electrical conducting track (not shown) connected to the circular part 15.

The substrate 12 is also provided with a second electrical conductor (not shown). The connecting element 14 is provided with a third electrical conductor 16. Only a circular part 17 of the third electrical conductor 16 is shown in FIG. 2, the third electrical conductor 16 also comprises an electrical conducting track (not shown) connected to the circular part 15 and the second electrical conductor (not shown).

The substrate 12 and the connecting element 14 are made as a whole of a flexible foil onto which the first, second and third electrical conductors 13, 16 are applied, for example as a printed circuit.

FIG. 3 shows the assembly 11 comprising the substrate 12, the connecting element 14 and the component 1. The assembly 11 is obtained by mounting the component 1 on the substrate 12 and connecting the first electrode 2 of the component 1 by means of solder or electrically conducting glue to the circular part 15 of the first electrical conductor 13. Subsequently the flexible connecting element 14 is being bent to position the circular part 17 of the third electrical conductor 16 onto the second electrode 4 of the component 1 and to connect the circular part 17 of the third electrical conductor 16 to the second electrode 4 of the component 1 by means of solder or electrically conducting glue.

It is also possible to first connect the second electrode 4 to the circular part 17 of the third electrical conductor 16 and subsequently bent the flexible connecting element 14 with respect to the substrate 12 to connect the first electrode 2 to the circular part 15 of the first electrical conductor 13.

Figure 4A:
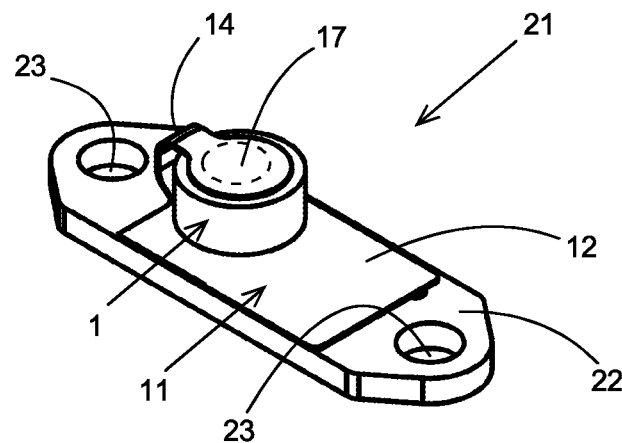
FIGS. 4A, 4B and 4C are a perspective view, a side view and a top view of a second embodiment of an assembly according to the invention.
Figure 4B:
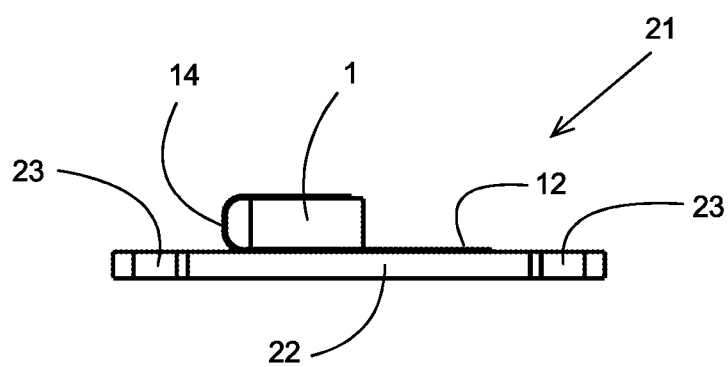
Figure 4C:
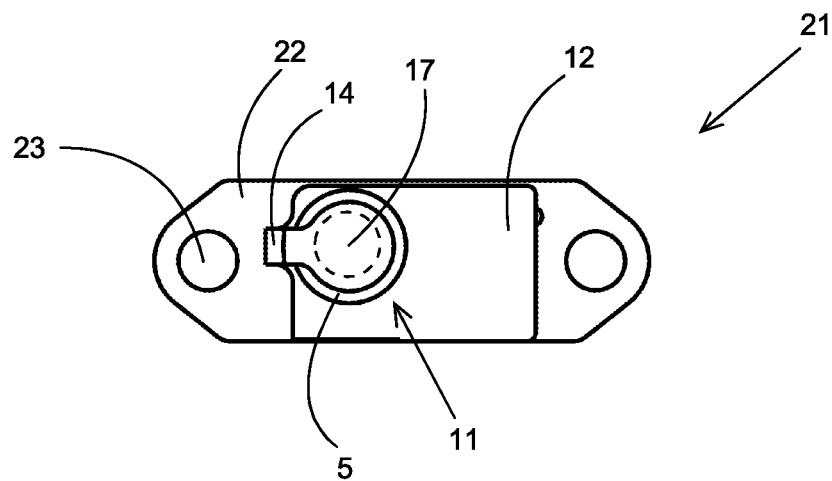

FIGS. 4A, 4B and 4C show a perspective view, a side view and a top view of a second embodiment of an assembly 21 according to the invention. The assembly 21 comprises a plate-shaped mounting bracket 22 provided with two holes 23 near opposite ends of the bracket 22. Between the two holes 23 the assembly 11 as shown in FIG. 3 is mounted on the bracket 22.

Figure 5:
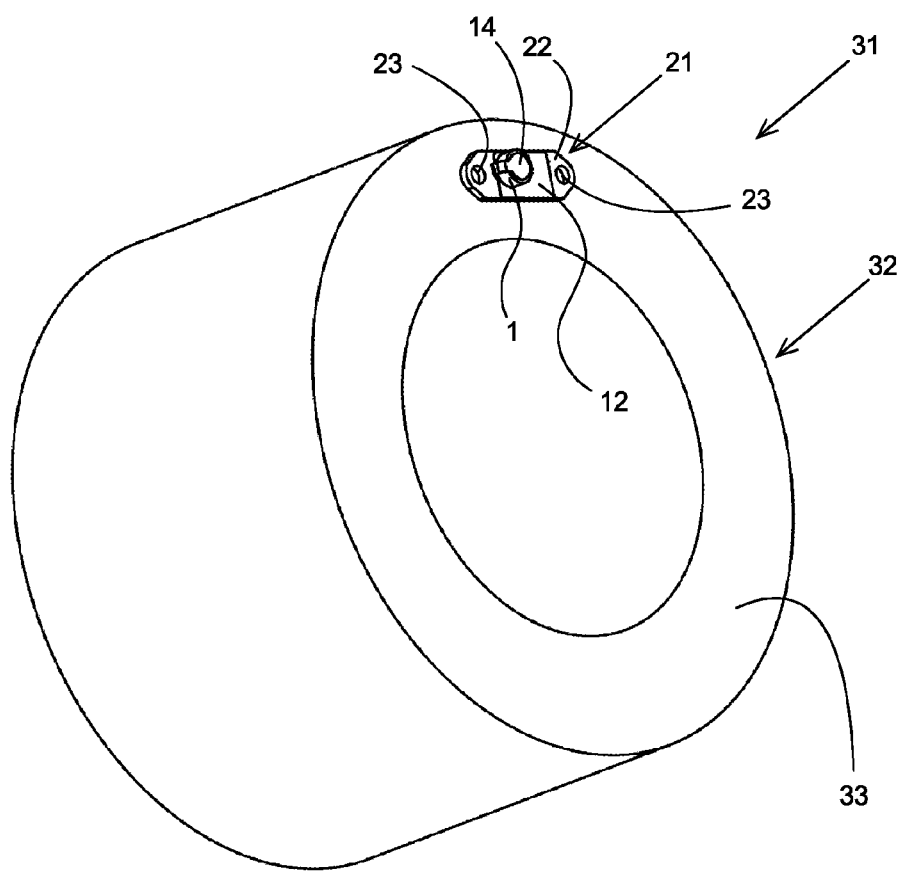
FIG. 5 is a perspective view of a third embodiment of an assembly according to the invention.

FIG. 5 shows a perspective view of a third embodiment of an assembly 31 according to the invention comprising a bearing 32 and the assembly 21 as shown in the FIGS. 4A, 4B, 4C. The assembly 21 is mounted on an outer surface 33 of the bearing 32. The first and second electrical conductors on the substrate 12 are connected to a measurement system like computer, to convert the signals obtained from the component 1 into information about the status of the bearing 32. Such a conversion is known in the art. Instead of a computer the relevant information may be extracted using an analogue electronic system or another kind of measurement system.

FIGS. 6A and 6B show a top view and a perspective view of a fourth embodiment of an assembly 41 according to the invention.

FIG. 6A show top view of a flexible foil 42 comprising a substrate 43, a connecting element 44 and a longitudinal extension 45. The substrate 43 and the longitudinal extension 45 are provided with a first electrical conductor 46 and a second electrical conductor 47. On the substrate 43, the first electrical conductor 46 is provided at its end with a ring-shaped part 48.

The connecting element 44 is provided with a third electrical conductor 49, which is connected to the second electrical conductor 47 at the transition from the substrate 43 to the connecting element 44. The third electrical conductor 49 is provided at its end remote of the substrate 43 with a ring-shaped part 50.

The part of the flexible foil 42 located inside the ring-shaped parts 48, 50 may be removed to obtain holes in the flexible foil 42.

A glue or adhesive with good transmission properties for acoustic signals may be applied in said holes. When mounting the assembly 41 on a bearing 33 for example, on the side of the substrate 43, the gel or adhesive will be able to transmit acoustic signals from the bearing to the sensor.

FIG. 6B shows the assembly 41 comprising the flexible foil 42 and the component 1. The assembly 41 is obtained by mounting the component 1 on the ring-shaped part 48 and connecting the first electrode 2 of the component 1 by means of solder or electrically conducting glue to the ring-shaped part 48 of the first electrical conductor 46. Subsequently the flexible connecting element 44 is being bent to position the ring-shaped part 50 of the third electrical conductor 44 onto the second electrode 4 of the component 1 and to connect the ring-shaped part 50 to the second electrode 4 by means of solder or electrically conducting glue. It is also possible to first connect the second electrode 4 to the ring-shaped part 50 and subsequently bent the flexible connecting element 44 with respect to the substrate 43 to connect the first electrode 2 to the ring-shaped part 48 of the first electrical conductor 48.

FIGS. 7A and 7B show a top view and a perspective view of a fifth embodiment of an assembly 51 according to the invention.

The assembly 51 differs only from the assembly 41 in that the third electrical conductor 49 is provided at its end with circular-shaped part 52 instead of the ring-shaped part 50.

The ring-shaped part 48 can also be replaced by a circular shaped part. Depending on the kind of component 1, the transmission of signals from the component 1 to a device connected to the longitudinal extension 45 is better with a ring-shaped part 50 or with a circular shaped part 52.

FIGS. 8A and 8B show a top view and a perspective view of a sixth embodiment of an assembly 61 according to the invention. FIG. 8A shows a top view of a substrate 63 provided with a longitudinal extension 65. The substrate 63 and the longitudinal extension 65 are provided with a first electrical conductor 66 and a second electrical conductor 47. On the substrate 63, the first electrical conductor 46 is provided at its end with two curved parts 68. On the substrate 63, the second electrical conductor 47 is provided at its end with two rectangular parts 69 located on opposite sides of the curved parts 68 of the first electrical conductor 46. Between the curved parts 68 a hole 70 is provided in the substrate 63. The hole 70 is elongated out past the circumference of the component 1 to allow gluing form the topside of the substrate 63 into the hole 70 when mounting the substrate 63 on a bearing 33 or bracket 22 to connect the component, to the bearing 33 or bracket 22 so that acoustic signals are well transmitted from the bearing 33 or bracket 22 to the component 1.

FIG. 8C shows a connecting element 71 of the assembly 61 according to the invention.

The connecting element 71 is made of a metal strip and comprises a centrally located circular part 72, two bridge parts 73 extending downwardly from the circular part 72 and two connection portions 74 extending parallel to the circular part 72. The connection portions 74 are located at a lower level than the circular part 72, seen in a direction perpendicular to the circular part 72.

FIG. 8B shows the assembly 61 comprising the substrate 63, the component 1 and the connecting element 71.

The assembly 61 is obtained by mounting the centrally located circular part 72 of the connecting element 71 onto the second electrode 4 of the component 1 and connecting the circular part 72 by means of solder or electrically conducting glue to the second electrode 4. The bridge parts 73 have a length so that the connection portions 74 are located in the same plane as the first electrode 2, once the connecting element 71 is connected to the second electrode 4.

Subsequently, the component 1 with the connecting element 71 connected thereto are mounted on the substrate 63, whereby the first electrode 2 of the component 1 is positioned on the curved parts 68 of the first electrical conductor 66 and the connection portions 74 of the connecting element 71 are positioned on the two rectangular parts 69 of the second electrical conductor 67. Thereafter the first electrode 2 is connected to the curved parts 68 and the connection portions 74 are connected to the two rectangular parts 69 by means of solder or electrically conducting glue.

It is also possible to first connect the first electrode 2 to the curved parts 68 of the first electrical conductor 66 and subsequently connect the circular part 72 of the connecting element 72 to the second electrode 4 and connect the connection portions 74 of the connecting element 72 to the two rectangular parts 69 of the second electrical conductor 67.

Figure 9:
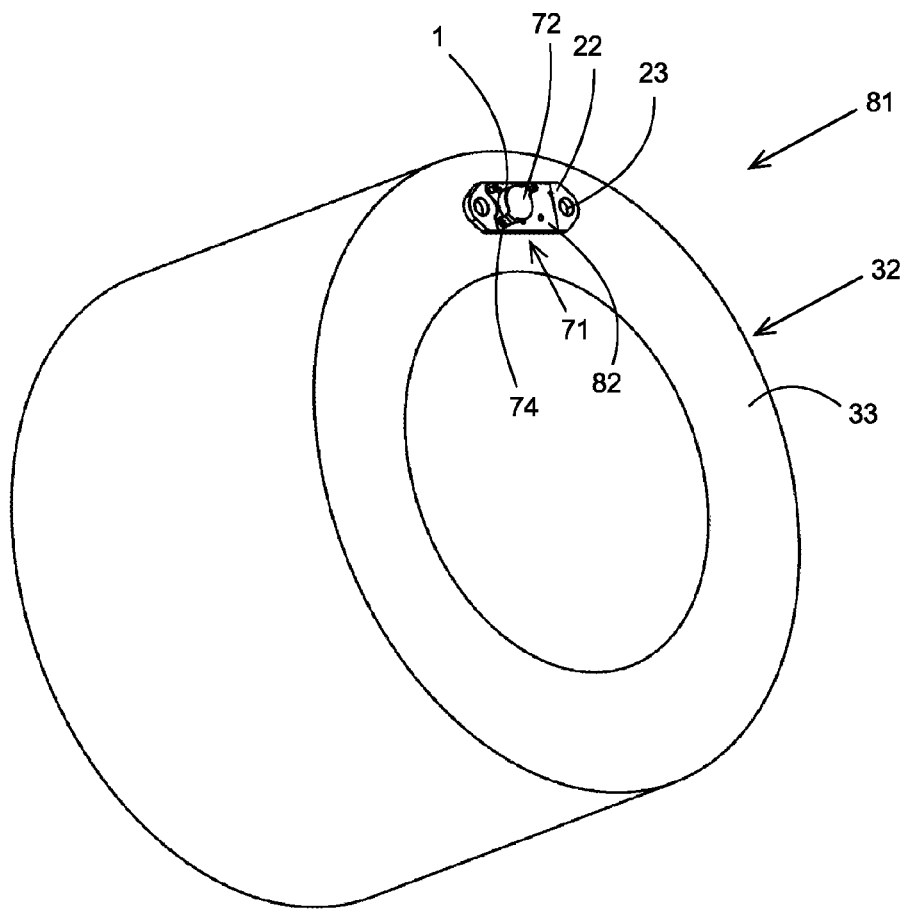
FIG. 9 is a perspective view of a seventh embodiment of an assembly according to the invention.

FIG. 9 is a perspective view of a seventh embodiment of an assembly 81 according to the invention. The assembly 81 is similar to the assembly 31 except that by the assembly 31 a flexible connecting element 14 is being used whilst by the assembly 81 the connecting element 81 as shown in FIG. 8 is being used to connect the second electrode 4 of the component 1 to a second electrical conductor on a substrate 82.

By all the embodiments of the assembly 11, 21, 31, 41, 51, 61, 81 according to the invention the first electrode 2 is located between the first electrical conductor 15, 48, 68 and the second electrode 4, seen in a direction perpendicular to the substrate 12, 43, 63, 82.

It is also possible that the connecting element comprises more than two connection portions.

It is possible to mount the bracket 22 by glue, for example, to an object in which case no holes 23 need to be provided in the bracket. The substrate can be mounted on a bearing, or a structure making contact with a bearing like a bearing housing or an intermediate bearing housing or be mounted on any other kind of object.

The person skilled in the art will realize that the present invention is by no means limited to the preferred embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

Any reference signs in the scope should not be construed as limiting the scope of the claims.

LIST OF REFERENCE SIGNS

Ref. No. Description
1 electrical component
2 bottom electrode
3 bottom side
4 top electrode
5 top side
11 assembly
12 substrate
13 first electrical conductor
14 connecting element
15 circular part
16 third electrical conductor
17 circular part
21 assembly
22 bracket
23 hole
31 assembly
32 bearing
33 outer surface
41 assembly
42 flexible foil
43 substrate
44 connecting element
45 longitudinal extension
46 first electrical conductor
47 second electrical conductor
48 ring-shaped part
49 third electrical conductor
50 ring-shaped part
51 assembly
52 circular-shaped part
61 assembly
63 substrate
65 longitudinal extension
66 first electrical conductor
67 second electrical conductor
68 curved part
69 rectangular part
70 hole 71 connecting element
72 circular part
73 bridge part
74 connection portion
81 assembly
82 substrate

What is claimed is:

1. An assembly comprising:
at least an electrical component comprising at least a first electrode located on a first side of the electrical component and a second electrode located on a second side of the electrical component the first side of the electrical component being opposite of the second side of the electrical component;
a substrate comprising at least a first electrical conductor and a second electrical conductor; and
a mounting element having a sensor side and a machine mounting side, the mounting element is fabricated of a rigid material, the sensor side and the machine mounting side being on opposite one another on the mounting element, the mounting element having a size and shape configured to be mounted upon a machine element with a surface of the machine mounting side formed to mount flushly on a mating surface of the machine element;
wherein the electrical component is permanently mounted on the substrate,
whereby the first electrode is electrically connected to the first electrical conductor and the second electrode is electrically connected to the second electrical conductor,
wherein the first electrode is located between the first electrical conductor and the second electrode in a direction perpendicular to the substrate,
wherein the second electrode is connected to the second electrical conductor by a connecting element extending between the second electrode and the second electrical conductor,
wherein a side of the substrate opposite to the at least the electrical component is permanently mounted to the sensor side of the mounting element.

2. The assembly according to claim 1, the connecting element further comprising a metal strip connected to the second electrode and to the second electrical conductor.

3. The assembly according to claim 2, wherein the second electrical conductor is located on at least two opposite sides of the electrical component,
wherein the metal strip is connected with at least two ends at opposite sides of the electrical component to the second connector and with a part located between the at least two ends to the second electrode.

4. The assembly according to claim 2, wherein the metal strip is connected to at least one of the second electrode and the second electrical conductor by one of solder or electrically conducting glue.

5. The assembly according to claim 1, wherein the connecting element is a flexible foil provided with a third electrical conductor, which flexible foil is connected to the substrate,
wherein a first end of the third electrical conductor is connected to the second electrical conductor whilst a second end of the third electrical conductor is connected to the second electrode.

6. The assembly according to claim 5, wherein the second end of the third electrical conductor is connected to the second electrode by one of solder or electrically conducting glue.

7. The assembly according to claim 5, wherein the substrate is a flexible foil forming a hole with the flexible foil of the connecting element.

8. The assembly according to claim 1, the substrate further comprising a hole, wherein the first electrode is located at least partially around the hole.

9. The assembly according to claim 1, wherein the component is a sensor.

10. The assembly according to claim 9, wherein the sensor is selected from a group of sensors, the group of sensors comprising: an acoustic emission sensor, a vibration sensor, an ultrasound sensor, a shear vibration crystal sensor, or other piezoelectric sensors.

11. The assembly according to claim 1, the assembly further comprising one of a bearing or a structure making contact with a bearing onto which the one of the bearing or the structure the substrate is mounted thereon.

12. A component suitable for assembly onto a mounting element, the component comprising:
a first electrode located on a first side of the electrical component and a second electrode located on a second side of the electrical component the first side of the electrical component being opposite of the second side of the electrical component;
a connecting element including a metal strip; and
a mounting element having a sensor side and a machine mounting side, the mounting element is fabricated of a rigid material, the sensor side and the machine mounting side being on opposite one another on the mounting element, the mounting element having a size and shape configured to be mounted upon a machine element with a surface of the machine mounting side formed to mount flushly on a mating surface of the machine element;
wherein the metal strip is connected to the second electrode, whilst at least one end of the metal strip is located in a same plane as the first electrode;
a substrate comprising:
at least a first electrical conductor and a second electrical conductor,
wherein the component is permanently mounted on the substrate,
whereby the first electrode is electrically connected to the first electrical conductor and the second electrode is electrically connected to the second electrical conductor,
wherein the first electrode is located between the first electrical conductor and the second electrode in a direction perpendicular to the substrate,
wherein the second electrode is connected to the second electrical conductor by the connecting element extending between the second electrode and the second electrical conductor,
wherein a side of the substrate opposite to the electrical component is permanently mounted to the sensor side of the mounting element.

13. A method for mounting an electrical component on a mounting element, the electrical component comprising at least a first electrode located on a first side of the electrical component and a second electrode located on a second side of the electrical component the first side of the electrical component being opposite of the second side of the electrical component, wherein a substrate comprises at least a first and second electrical conductor, the method comprising steps of:
electrically connecting the first electrode to the first electrical conductor using a permanent electro-mechanical connection, wherein the first electrode is located between the first electrical conductor and the second electrode in a direction perpendicular to the substrate;

electrically connecting the second electrode to the second electrical conductor by a connecting element extending between the second electrode and the second electrical conductor;

obtaining a mounting element, the mounting element having a sensor side and a machine mounting side, the mounting element is fabricated of a rigid material, the sensor side and the machine mounting side being on opposite one another on the mounting element, the mounting element having a size and shape configured to be mounted upon a machine element with a surface of the machine mounting side formed to mount flushly on a mating surface of the machine element; and mounting a side of the substrate opposite to a side of the substrate having the at least the electrical component permanently mounted thereto to the sensor side of the mounting element.

14. The method according to claim 13, the method further comprising a step of:

electrically connecting a metal strip of the connecting element to the second electrode and to the second electrical conductor by one of solder or electrically conducting glue.

15. The method according to claim 13, wherein the connecting element is a flexible foil provided with a third electrical conductor, the method further comprising a step of:

electrically connecting the flexible foil to the substrate, wherein a first end of the third electrical conductor is connected to the second electrical conductor whilst a second end of the third electrical conductor is connected to the second electrode by one of solder or electrically conducting glue.

* * * * *